(12) United States Patent
Otremba et al.

(10) Patent No.: US 6,776,663 B2
(45) Date of Patent: Aug. 17, 2004

(54) ELECTRONIC COMPONENT WITH ISOLATION BARRIERS BETWEEN THE TERMINAL PINS

(75) Inventors: Ralf Otremba, München (DE); Xaver Schlögel, Sachsenkam (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/008,241

(22) Filed: Nov. 8, 2001

(65) Prior Publication Data

US 2002/0094710 A1 Jul. 18, 2002

(30) Foreign Application Priority Data

Nov. 8, 2000 (DE) .......................................... 100 55 177

(51) Int. Cl.[7] .............................................. H01R 24/00
(52) U.S. Cl. ..................................... 439/660; 361/717
(58) Field of Search ................................ 439/660, 680; 361/717, 719

(56) References Cited

U.S. PATENT DOCUMENTS

| | | | | |
|---|---|---|---|---|
| 3,095,526 A | | 6/1963 | Thornton ..................... 257/717 |
| 5,249,978 A | * | 10/1993 | Gazda et al. ............... 439/246 |
| 5,340,993 A | * | 8/1994 | Salina et al. ................ 250/551 |
| 5,342,221 A | * | 8/1994 | Peterson ..................... 439/677 |
| 5,491,460 A | * | 2/1996 | Krasser et al. ................ 337/70 |

FOREIGN PATENT DOCUMENTS

DE 69 48 923 12/1969

* cited by examiner

*Primary Examiner*—Renee Luebke
*Assistant Examiner*—Ann McCamey
(74) *Attorney, Agent, or Firm*—Laurence A. Greenberg; Werner H. Stemer; Ralph E. Locher

(57) ABSTRACT

An electronic component has a housing and at least two terminal pins protruding out from a first side face of the housing. The housing has an isolation barrier formed between the at least two terminal pins. The isolation barrier extends the leakage path between two neighboring terminal pins and consequently increases the dielectric strength.

10 Claims, 4 Drawing Sheets

ELECTRONIC COMPONENT WITH ISOLATION BARRIERS BETWEEN THE TERMINAL PINS

BACKGROUND OF THE INVENTION

Field of the Invention

The present invention relates to an electronic component having a housing and at least two terminal pins protruding from one side of the housing.

A component of this type is, for example, a transistor, or a diode. In the production of components of this type, after completion of the semiconductor processes, it is known to connect terminals of the semiconductor body to terminal pins and to encapsulate the resulting formation in an electrically insulating plastic. The terminal pins, which are to be soldered onto a printed-circuit board, in this case usually protrude from the same side face out of the housing that is formed by the encapsulation.

During the subsequent operation of the component, when a voltage is applied between the terminal pins, leakage currents may occur between the terminal pins at the surface of the side face from which the terminal pins protrude, thereby reducing the dielectric strength of the component considerably.

SUMMARY OF THE INVENTION

It is accordingly an object of the invention to provide an electronic component which overcomes the above-mentioned disadvantages of the prior art apparatus of this general type. In particular, it is an object of the invention to provide an electronic component in which the influence of leakage currents on the dielectric strength is reduced.

With the foregoing and other objects in view there is provided, in accordance with the invention, an electronic component including a housing having a first side face and at least two terminal pins protruding out of the first side face of the housing. The housing has an isolation barrier that is formed between the two terminal pins.

In the case of the component according to the invention, at least one isolation barrier is provided between the terminal pins on the side face from which the at least two terminal pins protrude out of the housing. This isolation barrier, which preferably consists of the same material as the rest of the housing, extends the leakage path between two neighboring terminal pins and consequently increases the dielectric strength of the component. In the case of conventional components without an isolation barrier, the length of the leakage path between two neighboring terminal pins corresponds to the shortest path connecting these terminal pins. By contrast, the leakage path in the case of the component is increased by twice the height of the isolation barrier, which leads to a considerable gain in dielectric strength.

In accordance with an added feature of the invention, the isolation barrier between the terminal pins is integrally formed onto the housing. As a result, the housing with the isolation barrier can be produced using a suitable mold in a process step in which the active part of the component with the terminal pins connected to it is encapsulated in a plastic. Instead of an electrically isolating plastic, it is of course possible to use any other desired housing material, for example a ceramic.

In accordance with an additional feature of the invention, the terminal pins protrude out of the housing such that they are arranged in a row next to one another.

In accordance with a concomitant feature of the invention, of the two neighboring terminal pins, in each case one terminal pin is arranged closer to a first edge of the side face from which the terminal pins protrude, and that the other terminal pin is arranged closer to a second edge, lying opposite the first edge.

Other features which are considered as characteristic for the invention are set forth in the appended claims.

Although the invention is illustrated and described herein as embodied in an electronic component with isolation barriers between the terminal pins, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
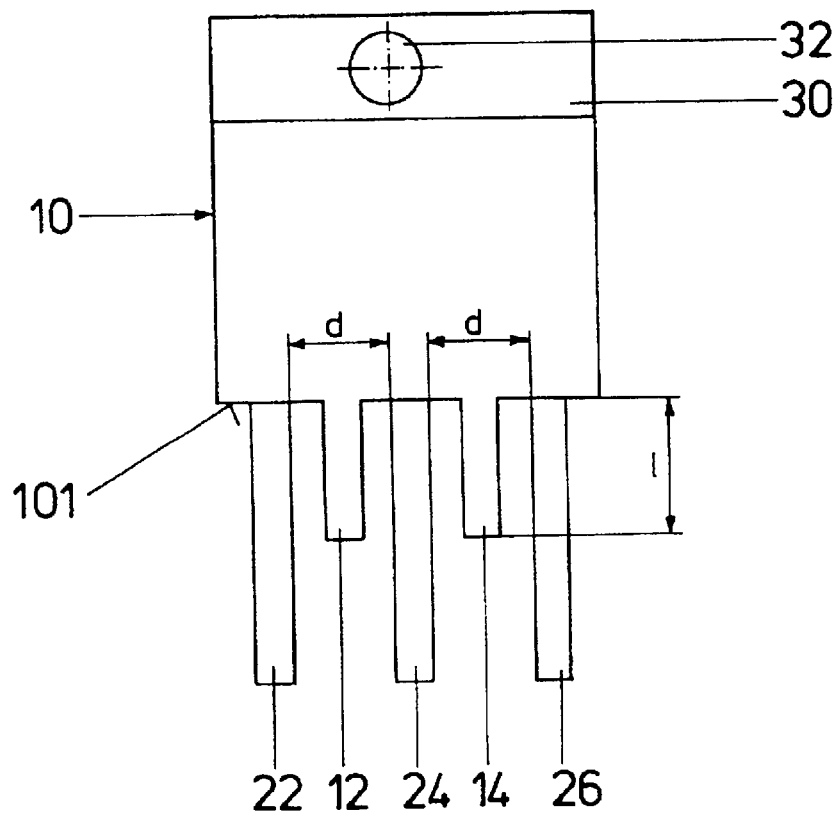
FIG. 1 shows a front view of a first exemplary embodiment of a component.
Figure 2:
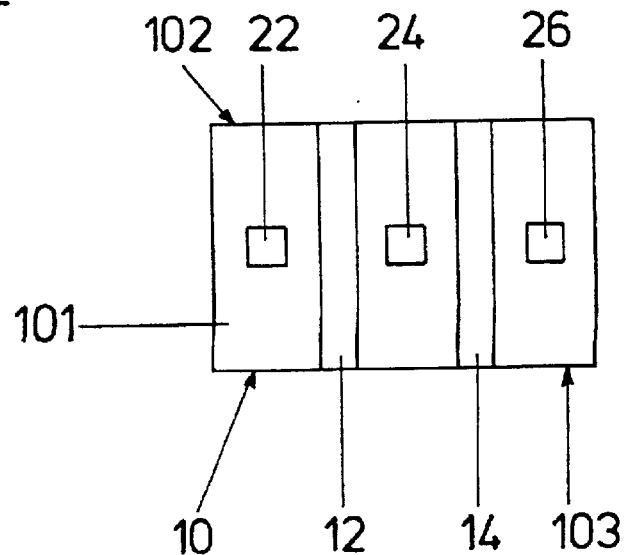
FIG. 2 shows a plan view, from below, of the first exemplary embodiment of the component.
Figure 3:
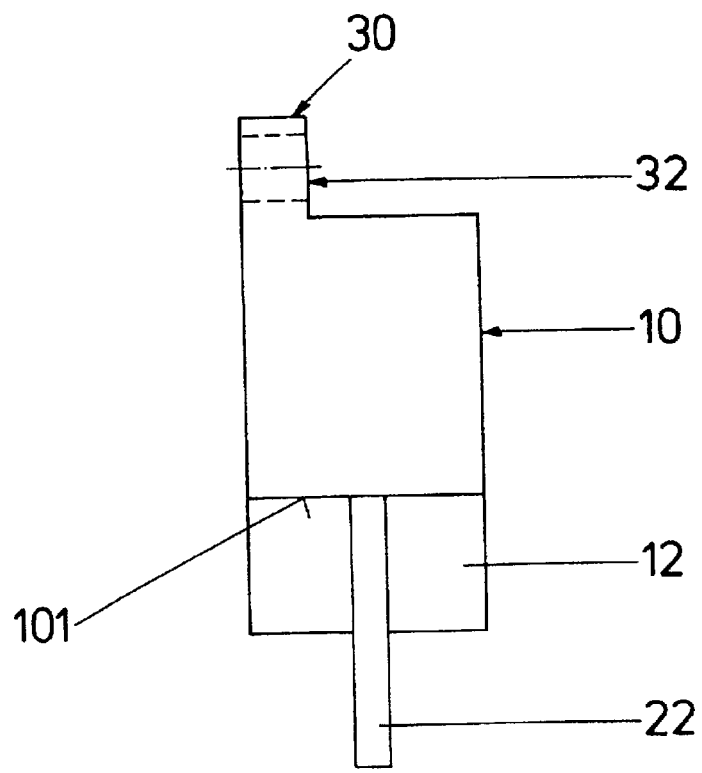
FIG. 3 shows a side view of the first exemplary embodiment of the component.

Referring now to the figures of the drawing in detail and first, particularly, to FIGS. 1–3 thereof, there is shown a first exemplary embodiment of an electronic component. FIG. 1 shows a front view, FIG. 2 shows a plan view, from below, and FIG. 3 shows a side view of the electronic component. Unless otherwise indicated, the same reference numerals are used to designate the same parts throughout the figures. The component has a housing 10 and terminal pins 22, 24, 26 that protrude from a lower side face 101 of the housing 10. The component is, in particular, a semiconductor component having a semiconductor body with active regions that are arranged in the housing 10 and that are electrically bonded to the terminal pins 22, 24, 26. The component is, for example, a transistor, the terminal pins 22, 24, 26 serving as gate, source or drain terminals. In the exemplary embodiment, a tongue or butt strap 30 is formed onto the upper region of the housing 10. The butt strap 30 has a through-hole 32 that serves for fastening the component on a heat sink.

Isolation barriers 12, 14 are provided on the side face 101, from which the terminal pins 22, 24, 26 protrude out of the housing 10. The isolation barriers 12, 14 are arranged in each case between two neighboring terminal pins 22, 24 and 24, 26. As can be seen in particular from FIG. 2, the isolation barriers 12, 14 reach from a first edge 102 up to a second edge 103 of the side face 101. The isolation barriers 12, 14 are in this case preferably arranged equally far away from the terminal pins 22, 24, 26 that they respectively isolate. The isolation barriers 12, 14 are preferably integrally formed onto the housing 10 and consequently consist of the same material as the rest of the housing 10.

As can be seen in particular from FIGS. 1 and 3, the terminal pins 22, 24, 26 protrude downward, starting from the side face 101, over and beyond the isolation barriers 12, 14 and can be soldered at the projecting portions to a printed-circuit board.

In the exemplary embodiment, the distance between neighboring terminal pins 22 and 24 and between terminal pins 24 and 26 is d (See FIG. 1). The height of the isolation barriers, starting from the side face 101, is l. In the exemplary embodiment, the terminal pins 22, 24, 26 are arranged approximately midway between the edges 102, 103 of the side face 101. The distance between the terminal pins 22, 24, 26 from each of the side edges is the same as the height of the isolation barriers 12, 14 so that the length of the shortest leakage path between two neighboring terminal pins 22 and 24 or 24 and 26 is obtained from the distance d between the two neighboring terminal pins 22 and 24 or 24 and 26 and twice the height l of the isolation barriers 12, 14. The height l of the isolation barriers 12 to 14 preferably corresponds to the distance d between the terminal pins 22 and 24 or 24 and 26 or is greater.

On the basis of DIN VDE 0100, the dielectric strength of a component that has a distance d of 1.8 mm between the terminal pins and that does not have isolation barriers is 630 V. Given the same distance d of 1.8 mm between the terminal pins and isolation barriers with a height l=2.0 mm, the resultant length of the leakage path is d+2*l=5.8 mm, for which the dielectric strength according to DIN is already 1600 V. The isolation barriers 12 and 14, which are simple to produce on the housing 10, allow the dielectric strength of the component to be increased considerably when a voltage is applied between the terminal pins 22, 24, 26. The isolation barriers 12 and 14 extend the leakage path. The dielectric strength is in this case still below the dielectric strength which could be achieved if the terminal pins were isolated from one another exclusively by means of air, i.e. without the housing 10 and consequently without a leakage path. The dielectric strength of air is 2 kV/mm.

In the case of the exemplary embodiment according to FIGS. 1 to 3, it was assumed that the distance from the terminal pins to the side edges 102, 103 is much greater than the height l of the isolation barriers 12, 14, and that the shortest leakage path, and consequently that which is decisive for the dielectric strength, runs from one of the terminal pins 22, 24, 26 over the isolation barrier to the neighboring terminal pin. If the distance from the terminal pins 22, 24, 26 to the side edges 102, 103 is less than the height of the isolation barriers 22, 24, the shortest leakage path runs via the side edges 102, 103 past the isolation barriers. The shortest leakage path in this case, however, is still longer than the shortest leakage path without an isolation barrier 22, 24.

Figure 4:
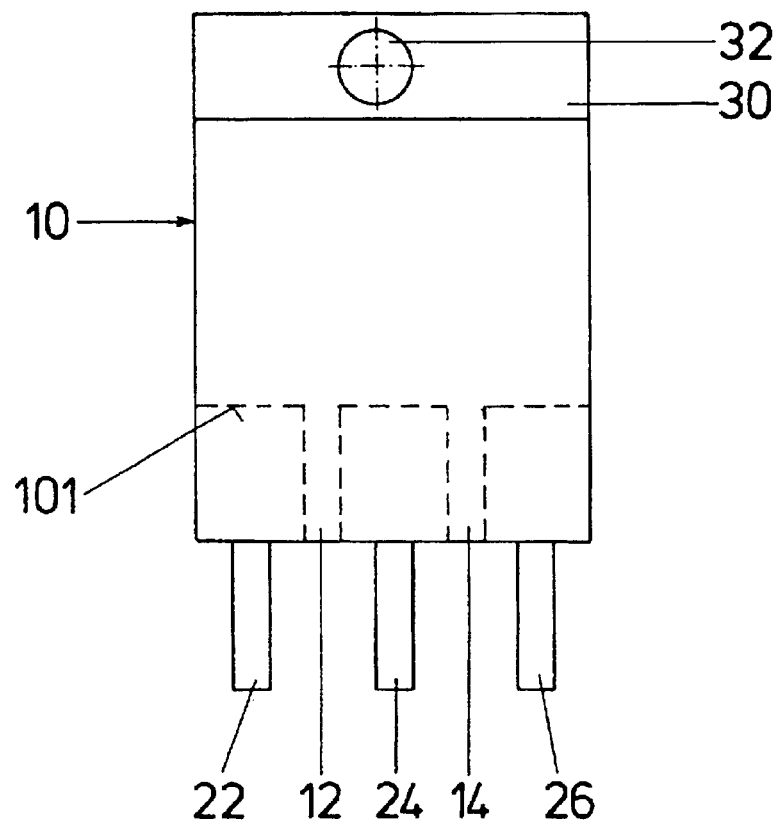
FIG. 4 shows a front view of a second exemplary embodiment of the component.
Figure 5:
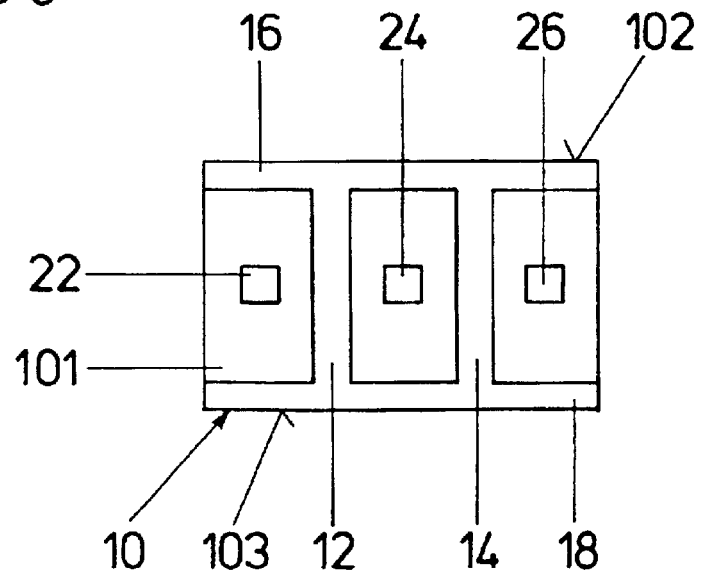
FIG. 5 shows a plan view, from below, of a second exemplary embodiment of the component.

In this case, the dielectric strength can be increased by the structure of a second exemplary embodiment of the electronic component, which is shown in FIGS. 4 and 5. FIG. 4 shows a front view of the component and FIG. 5 shows in plan view of the component from below. The component shown in FIGS. 4 and 5 differs from the component shown in FIGS. 1 to 3 by the addition of two side walls 16, 18, which run on the lower side face 101 along the first and second edges 102, 103. The height of the side walls 16, 18 preferably corresponds to the height of the isolation barriers 12, 14. The side walls 16, 18 along with the isolation barriers 12, 14 enclose the middle pin 24 of the three terminal pins 22, 24, 26 from four sides and enclose the two outer terminal pins 22, 26 in each case from three sides.

The shortest leakage path between the terminal pins 22 and 24 or 24 and 26 in this exemplary embodiment runs over the isolation barriers 12 and 14 and is d+2l.

Figure 6:
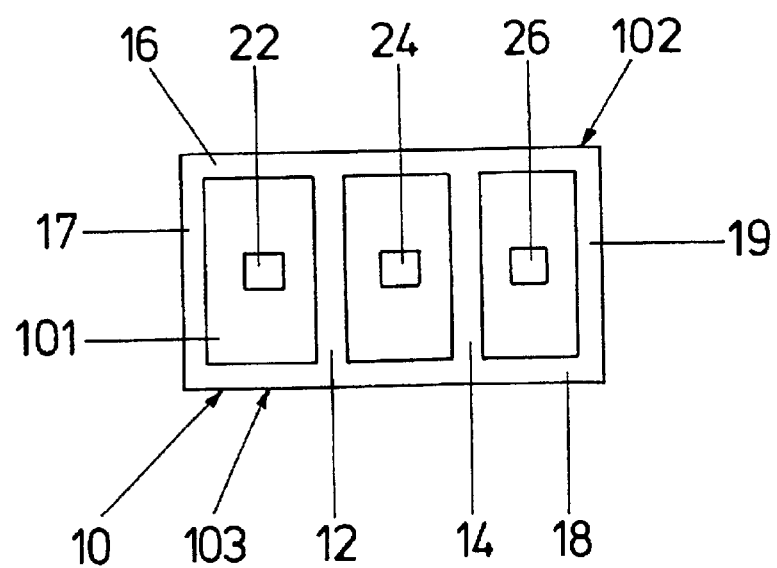
FIG. 6 shows a plan view, from below, of a third exemplary embodiment of the component.

FIG. 6 shows a plan view, from below, of a third exemplary embodiment of the electronic component in which the two outer terminal pins are also enclosed from four sides by providing additional side walls 17, 19. The height of the additional side walls 17, 19 preferably corresponds to the height of the isolation barriers 12, 14 and/or of the side walls 16, 18.

The invention, which has been described above in conjunction with an electronic component having three terminal pins, for example a transistor, can of course be applied to any desired electronic component in which terminal pins protrude from a side face out of a housing. Examples that may be mentioned are diodes with two terminal pins, thyristors, and complex integrated circuits with more than three terminal pins.

Figure 7:
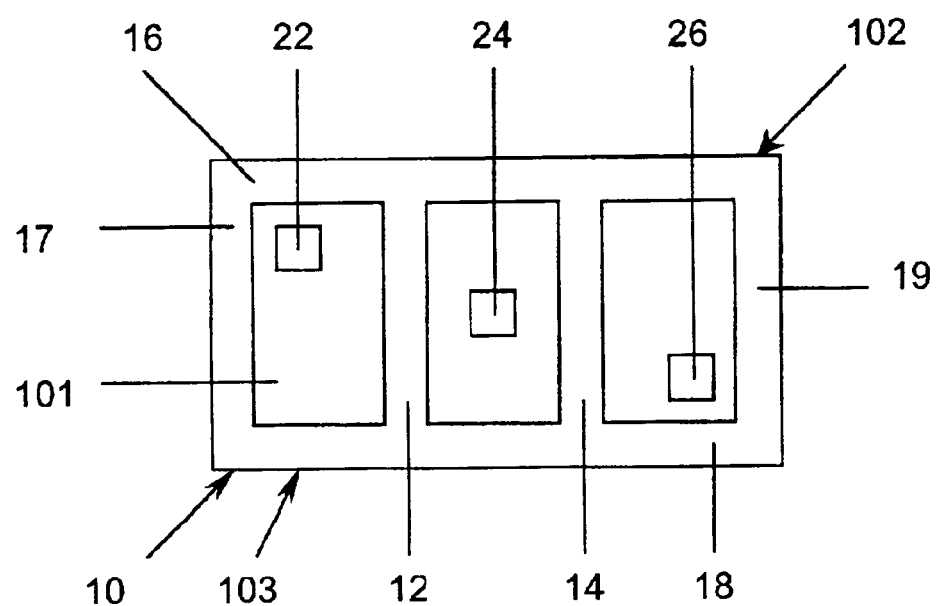
FIG. 7 shows a plan view, from below, of a fourth exemplary embodiment of the component.

FIG. 7 shows a plan view, from below, of a fourth exemplary embodiment of the component. The fourth exemplary embodiment substantially corresponds to the third exemplary embodiment, except that the terminal pin 22 is located closer to the side wall 16, while the terminal pin 26 has been located closer to the side wall 18.

We claim:

1. An electronic component, comprising:
a semiconductor unit having:
a housing having a first side face; and
at least two terminal pins protruding out of said first side face of said housing;
said housing having an isolation barrier formed outside said housing between said two terminal pins, said isolation barrier having a side remote from said first side face of said housing, and said two terminal pins protruding beyond said side of said isolation barrier.

2. The component according to claim 1, wherein:
said first side face has a first edge and a second edge opposite said first edge; and
said isolation barrier is a plate extending on said first side face from said first edge to said second edge.

3. The component according to claim 1, wherein said housing has at least one side wall that together with said isolation barrier encloses said two terminal pins from at least three sides.

4. The component according to claim 1, wherein said at least two terminal pins protrude out of said housing next to each other in a row.

5. The component according to claim 1, wherein:
said first side face has a first edge and a second edge opposite said first edge;
a first one of said two terminal pins is located closer to said first edge than a second one of said two terminal, pins; and
said second one of said two terminal pins is located closer to said second edge than said first one of said two terminal pins.

6. The component according to claim 1, wherein said isolation barrier is integrally formed onto said housing.

7. The component according to claim 6, wherein:
said first side face has a first edge and a second edge opposite said first edge; and said isolation barrier is a plate extending on said first side face from said first edge to said second edge.

8. An electronic component, comprising:

a semiconductor unit having:
- a housing having a first side face and side walls; and
- at least two terminal pins protruding out of said first side face of said housing;

said housing having a plurality of isolation barriers formed outside said housing, each of said isolation barriers being disposed between a respective two of said at least two terminal pins;

at least some of said side walls of said housing together with at least one of said plurality of said isolation barriers surrounding at least one of said at least two terminal pins from four sides.

9. A transistor, comprising:

a semiconductor unit having:
- a housing having a first side face; and
- at least two terminal pins protruding out of said first side face of said housing;

said housing having an isolation barrier formed outside said housing between said two terminal pins, said isolation barrier having a side remote from said first side face of said housing, and said two terminal pins protruding beyond said side of said isolation barrier.

10. A transistor, comprising:

a semiconductor unit having:
- a housing having a first side face and side walls; and
- at least two terminal pins protruding out of said first side face of said housing;

said housing having a plurality of isolation barriers formed outside said housing, each of said isolation barriers being disposed between a respective two of said at least two terminal pins;

at least some of said side walls of said housing together with at least one of said plurality of said isolation barriers surrounding at least one of said at least two terminal pins from four sides.

\* \* \* \* \*